(12) United States Patent  
Lamerichs et al.

(10) Patent No.: US 8,498,688 B2
(45) Date of Patent: Jul. 30, 2013

(54) MAGNETIC RESONANCE DEVICE AND METHOD

(75) Inventors: Rudolf Mathias Johannes Nicolaas Lamerichs, Eindhoven (NL); Muhammed Yildirim, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 454 days.

(21) Appl. No.: 12/530,786

(22) PCT Filed: Mar. 17, 2008

(86) PCT No.: PCT/IB2008/050985
§ 371 (c)(1),
(2), (4) Date: Sep. 11, 2009

(87) PCT Pub. No.: WO2008/114194
PCT Pub. Date: Sep. 25, 2008

(65) Prior Publication Data
US 2010/0036235 A1    Feb. 11, 2010

(30) Foreign Application Priority Data
Mar. 19, 2007  (EP) ..................... 07104394

(51) Int. Cl.
*A61B 5/05*    (2006.01)
(52) U.S. Cl.
USPC .......................... 600/410; 600/407
(58) Field of Classification Search
USPC ....................................... 600/410
See application file for complete search history.

(56) References Cited

U.S. PATENT DOCUMENTS

| 4,585,992 A | 4/1986 | Maudsley et al. |
| 4,838,274 A | 6/1989 | Schweighardt et al. |
| 5,729,139 A * | 3/1998 | Goto ............................. 324/309 |
| 6,671,536 B2 * | 12/2003 | Mistretta ...................... 600/410 |
| 6,946,839 B2 | 9/2005 | Porter |

OTHER PUBLICATIONS

Gewiese et al: "Human Eye: Visualization of Perfluorodecalin With F-19 MR Imaging"; Radiology 1992, 185: pp. 131-133.
Caruthers et al: "In Vitro Demonstration Using 19F Magnetic Resonance to Augment Molecular Imaging With Paramagnetic Perfluorocarbon Nanoparticles at 1.5 TESLA"; Investigative Radiology, Mar. 2006, vol. 41, No. 3, pp. 305-312.
Dydak et al: "Trading Spectral Separation at 3T for Acquisition Speed in Multi Spin-Echo Spectroscopic Imaging"; AJNR American Journal of Neuroradiology, Aug. 2006, vol. 27, No. 7, pp. 1441-1446.

(Continued)

*Primary Examiner* — Unsu Jung
*Assistant Examiner* — Saurel J Selkin

(57) ABSTRACT

A device for magnetic resonance imaging of a body placed in an examination volume is configured to generate a series of MR spin echo signals from a first nuclear spin species by subjecting at least a portion of the body to an MR imaging pulse sequence. The MR imaging pulse sequence includes a spatially non-selective excitation RF pulse, a plurality of refocusing RF pulses, and a plurality of phase encoding switched magnetic field gradients. The device is further is configured to acquire the MR spin echo signals without application of frequency encoding magnetic field gradients; and to reconstruct an MR image from the acquired MR spin echo signals.

15 Claims, 3 Drawing Sheets

OTHER PUBLICATIONS

Dydak et al: "MR Spectroscopy and Spectroscopic Imaging: Comparing 3.0 T Versus 1.5T"; Neuroimaging Clinics of North America, May 2006, vol. 16, No. 2, pp. 269-283.

Traber et al: "Reduction of Measurement Time by 1H-MR Turbo Spectroscopic Imaging of the Brain"; ROFO-Fortschritte Auf Dem Gebiet Der Rontgenstrahlen Und Derbildgebenden Verfahren, Thieme Verlag, Stuttgart, DE, vol. 166, No. 3, Mar. 1, 1997, pp. 221-229.

Meyerhoff D.: "Magnetic Resonance Spectroscopic Imaging"; NMR in Physiology and Biomedicine, Jan. 1, 1994, pp. 169-184.

Anonymous: "Spectroscopy Application Guide for Gyroscan ACS-NT Release 6"; 2001 Philips Medical Systems, 6 Page Document.

Mulkern et al: "Multiecho Approaches to Spectroscopic Imaging of the Brain"; Annals of the New York Academy of Sciences, 1997, vol. 820, pp. 97-122.

Duyn et al: "Fast Proton Spectroscopic Imaging of Human Brain Using Multiple Spin-Echoes"; Magnetic Resonance in Medicine, vol. 30, Issue 4, 1993, pp. 409-414.

Mason et al: "A Novel Editing Technique for 19F MRI:Molecule-Specific Imaging"; Magnetic Resonance Imaging; 1990, vol. 8 (6), pp. 729-736.

Keupp et al: "Efficient 19F Imaging of Multi-Spectral-Line Contrast Agents: Aliasing Serves to Minimize Time Encoding", Proceedings of the ISMRM, 14th Scientific Meeting, May 6, 2006, Seattle, WA, One Page Document.

* cited by examiner

MAGNETIC RESONANCE DEVICE AND METHOD

FIELD OF THE INVENTION

The invention relates to a device for magnetic resonance imaging of a body placed in an examination volume.

BACKGROUND OF THE INVENTION

Furthermore, the invention relates to a method for MR imaging and to a computer program for an MR device.

In magnetic resonance imaging (MRI) pulse sequences consisting of RF pulses and switched magnetic field gradients are applied to an object (a patient) placed in a homogeneous magnetic field within an examination volume of an MR device. In this way, phase and frequency encoded magnetic resonance signals are generated, which are scanned by means of RF receiving antennas in order to obtain information from the object and to reconstruct images thereof. Since its initial development, the number of clinically relevant fields of application of MRI has grown enormously. MRI can be applied to almost every part of the body, and it can be used to obtain information about a number of important functions of the human body. The pulse sequence, which is applied during an MRI scan, plays a significant role in the determination of the characteristics of the reconstructed image, such as location and orientation in the object, dimensions, resolution, signal-to-noise ratio, contrast, sensitivity for movements, etcetera. An operator of an MRI device has to choose the appropriate sequence and has to adjust and optimize its parameters for the respective application.

So-called molecular imaging and diagnostics (MID) is rapidly developing during the last years. MID is sometimes defined as the exploitation of specific molecules for image contrast and for diagnosis. This definition refers to the in-vivo measurement and characterization of cellular and molecular level processes in human subjects and to the analysis of biomolecules to screen, diagnose and monitor the human health status and to assess potential risks. An important prerequisite for molecular imaging is the ability to image specific molecular targets.

At the moment, MR imaging is considered to be one of the most promising modalities in molecular imaging. Therefore, MR imaging is expected to play an essential role in the clinical use of MID for screening, targeted drug delivery and therapy evaluation. Highly sensitive contrast agents have recently been used to allow MR imaging of molecular targets and gene expression. As mentioned above, MRI can visualize the anatomy with good spatial resolution, is applicable to all body regions and will allow reproducible and quantitative imaging. It can also be used for intravascular and needle image-guided drug delivery. MR can also partly assess molecular information, for example through spectroscopy.

It is important to note in this context that in particular $^{19}$F MRI has a high potential in the field of MID and also in pharmaceutical research. $^{19}$F MRI allows the direct quantification of nano particles, which can be used as contrast agents in MID. These nano particles contain $^{19}$F based molecules, such as, e.g., PFOB (perfluoro-octyl bromide). The particles are coated with a functionalized protective and stabilizing lipid layer. Depending on the functional groups on the lipid layer the nano particles will bind to protein markers specific to a disease and accumulate at the sites within the body of the patient where the disease is progressing. The accumulated nano particles will show up as bright spots in a corresponding $^{19}$F MR image. For an accurate detection and localization of a disease within the body, a precise determination of the position of the bright spots caused by the accumulated nano particles is required.

However, $^{19}$F MRI and contrast agent quantification is frequently complicated by strong chemical shift artifacts induced by multi-line spectra of the $^{19}$F nuclear spins with a shift range of around 100 ppm. This problem equally occurs in MRI of other nuclei like $^{31}$P or $^{13}$C. There are many methods known in the art to deal with these problems, such as line saturation or line selection methods, chemical shift encoding techniques or certain deconvolution and iterative reconstruction methods. But these known methods typically lead to significantly reduced SNR (signal-to-noise ratio), significantly increased imaging time, and/or need complex and potentially unstable calculations during image reconstruction.

So-called Turbo Spectroscopic Imaging (TSI) methods relating to spectroscopic MRI are known in the art (see Jeff H. Duyn et al. in Magnetic Resonance in Medicine, Volume 30, Issue 4, 1993, pages 409-414). These known methods provide a full spectral information for each voxel or pixel location but do not provide a satisfactory solution regarding the above-mentioned MID-specific problems in connection with MRI of nuclei having strong chemical shifts. In MID, a single spin density image is typically required to assess local contrast agent concentrations. An optimum SNR is required for MID applications in order to enable accurate assessment of the distribution of a contrast agent in the examined body. A high SNR is crucial in MID because the SNR determines the resolution (voxel size) of the MR images. On the other hand, the particle size and the amount of contrast agent to be used depend on the SNR. Smaller particles and a high spatial resolution enable the detection of smaller lesions, namely the diffusion into or uptake by smaller structures. Furthermore, a smaller amount of contrast agent does not only reduce the costs of the examination procedure, but also minimizes the risks associated with introducing non-physiological substances into the human body.

Therefore, it is readily appreciated that there is a need for an improved device for magnetic resonance imaging which provides maximum SNR for precise assessment of contrast agent distribution. It is consequently an object of the invention to provide an MR device that enables imaging with significantly reduced complications due to strong chemical shift artefacts. A further object of the invention is to provide an MR device, which permits to keep the scan time, i.e. the time required for acquisition of the MR signals for a complete MR image, within acceptable limits.

SUMMARY OF THE INVENTION

In accordance with the present invention, an MR device for magnetic resonance imaging of a body placed in an examination volume is disclosed, which comprises means for establishing a substantially homogeneous main magnetic field in the examination volume, means for generating switched magnetic field gradients superimposed upon the main magnetic field, means for radiating RF pulses towards the body, control means for controlling the generation of the magnetic field gradients and the RF pulses, means for receiving and sampling magnetic resonance signals, and reconstruction means for forming MR images from the signal samples. According to the invention the device is arranged to a) generate a series of MR spin echo signals from a first nuclear spin species by subjecting at least a portion of the body to an MR imaging pulse sequence comprising a spatially non-selective excitation RF pulse, a plurality of refocusing RF pulses, and a plurality of phase encoding switched magnetic field gradients;

b) acquire the MR spin echo signals without application of frequency encoding magnetic field gradients;

c) reconstruct an MR image from the acquired MR spin echo signals.

The MR device of the invention is arranged to generate MR spin echo signals by the application of a series of refocusing RF pulses. Signal dephasing caused by strong chemical shifts of the examined nuclear spin species is compensated for in this way. Furthermore, the MR spin echo signals are acquired without the application of slice selection and frequency encoding magnetic field gradients. Instead, a complete three-dimensional volume is excited, and k-space is sampled solely by means of phase encoding according to the invention. Because of the absence of magnetic field gradients both during the excitation phase and the readout phase of the applied MR imaging pulse sequence, chemical shift induced image artefacts, most notably so-called ghost images caused by the different resonance lines of the measured spins, are effectively avoided. This enables a precise localization of bright spots within the reconstructed MR image that are caused, e.g., by accumulation of a contrast agent containing the examined nuclear spin species at a site of a disease. Furthermore, the invention advantageously enables extremely fast spectroscopic imaging. Consecutive scans can be performed in a short time such that a high SNR can be achieved by signal averaging.

According to a preferred embodiment of the invention, the MR spin echo signals are acquired using phase encoding in only one or two spatial directions. As a result, the reconstructed MR image is a (one- or two-dimensional) projection image of the examined (three-dimensional) portion of the body of the patient. The spatial position of a site of accumulation of a contrast agent containing the measured nuclear spin species can be determined simply by combining at least two projection images acquired consecutively using different (preferably orthogonal) projection directions. The advantage of this approach is that the information relating to the positions of the accumulation sites can be investigated by only two or three consecutive scans and, thus, within a very short acquisition time.

Alternatively, a complete three-dimensional MR image can be acquired and reconstructed according to the invention. K-space is completely sampled in this case by the application of corresponding phase-encoding switched magnetic field gradients in all three spatial directions. The determination of the spatial positions of the sites of accumulation of a contrast agent showing up as bright spots in such a three-dimensional image is straightforward.

The device of the invention may further be arranged to apply a phase encoding scheme in step a) (see above) such that k-space is sampled along a plurality of radial directions. This is advantageous because a considerable increase of the SNR is intrinsic to such a radial sampling scheme. In case of radial encoding the central area of k-space is repeatedly scanned while a reduced sampling density is applied in the peripheral regions of k-space. The central region of k-space contains the intensity information while the peripheral regions of k-space contain the so-called high frequency components, i.e. the information determining the resolution of the final MR image. By means of a radial sampling scheme, the central region of k-space is generally oversampled while the peripheral regions may be only partly sampled. The resulting image has a very high SNR and, thus, an improved sensitivity. A minor reduction of resolution or, in other words, a little blurring in the reconstructed image, can be tolerated as long as the determination of the position of bright spots caused, e.g., by an accumulation of a contrast agent, is sufficiently accurate. The improved SNR is a major benefit of the technique of the invention since the required particle size as well as the amount of the used contrast agent can be reduced significantly.

In a practical embodiment of the invention, the measured first spin species has a chemical shift spectrum. The invention advantageously enables spectroscopic imaging simply by computing the Fourier transforms of the acquired MR spin echo signals. This can be used to reconstruct MR images selectively for spins having different chemical spectra. Multiple contrast agents, such as, e.g. PFOB and crown ether (CE), having distinguishable chemical shift spectra may be used. The different contrast agents may advantageously be functionalized to target at different diseases, or, e.g. at different stages of a disease. In this way it is made possible to investigate within a single examination whether the patient has, e.g., cancer and also whether the patient has an early or a late stage of cancer. These results can be used directly to select the appropriate therapeutic measures. Furthermore, the device of the invention may be arranged to reconstruct MR images for a predetermined spectral position in the chemical shift spectrum. The respective spectral position can be predetermined in order to obtain an image exclusively showing the distribution of a specific chemical compound. Alternatively, the device may be arranged to reconstruct MR images for the integrated intensity of the chemical shift spectrum. In this case the imaging technique of the invention does not distinguish between the different spectral positions. The integral intensity of the complete chemical shift spectrum contributes to the pixel or voxel values of the reconstructed image such that the SNR is optimized.

According to a preferred embodiment, the first nuclear spin species measured in accordance with the invention may be $^{19}$F. The nuclear spin of $^{19}$F renders the applied contrast agent visible in the MR image. It is well known that the main complication associated with $^{19}$F is that most perfluoro-compounds exhibit a broad chemical shift spectrum. The frequency encoding read-out gradients applied in conventional MR imaging sequences generate a response in the image for each spectral line of the chemical shift spectrum. Consequently, multiple image features stemming from a single accumulation site of the used contrast agent appear at different positions in the MR image. This multiplicity in the MR image impedes an accurate diagnostic interpretation of the image. Such problems caused by the $^{19}$F chemical shift spectrum are overcome by the invention involving both a spectroscopic read-out scheme without frequency encoding gradients and the elimination of slice selection magnetic field gradients. The $^{19}$F MR images may be acquired in accordance with the invention as two-dimensional projection images or as fully sampled three-dimensional volume images.

The imaging technique of the invention is related to the known TSI acquisition scheme (see above). In a TSI measurement the total scan time is determined by the sampling characteristics, hence the sampling frequency and the duration of the sampling steps. These parameters depend on the desired spectral resolution and bandwidth. For $^1$H measurements, the required bandwidth is about 1500 Hz in order to cover the whole spectrum of the hydrogen nuclei contained in different types of tissue (such as fat, water etc.). The required resolution is about 5-7 Hz, which is the typical width of the resonance lines in the $^1$H spectrum. Thus, when a bandwidth of 2000 Hz is considered, a sampling time of 128 ms will be required. The transverse relaxation time $T_2$ of $^1$H is typically in the region of 500 ms such that the maximum number of echoes that can be generated and acquired in a single shot of the MR imaging pulse sequence is approximately 6. As a result, the acquisition of a k-space grid including 32×32 phase encoding steps takes about 5-6 minutes. For $^{19}$F the situation is quite different. The bandwidth required for a $^{19}$F measurement is about 15 kHz and the necessary resolution is about 200 Hz. The $T_2$ relaxation time is in the region of 100 ms. Thus, when a bandwidth of 32 kHz is considered (to be on the safe side), a sampling time of only 4 ms will be required. Under these circumstances it is possible to acquire 16 echoes in a single shot of the MR imaging pulse sequence. Consequently, the time required to fill a k-space grid including 32×32 phase encoding steps will take not more than about 10 seconds. This is much faster than in $^1$H imaging.

The device of the invention may further be arranged to register the MR image reconstructed in step c) (see above) with an MR image acquired from a second nuclear spin species. By registering, e.g., a $^{19}$F image showing the sites of accumulation of a contrast agent as bright spots with a conventional $^1$H image the anatomical context of the detected lesions can be visualized directly.

The invention not only relates to a device but also to a method for magnetic resonance imaging of at least a portion of a body placed in an examination volume of an MR device. The method comprises the following steps:

a) generating a series of MR spin echo signals from a nuclear spin species by subjecting at least a portion of the body to an MR imaging pulse sequence comprising a spatially non-selective excitation RF pulse, a plurality of refocusing RF pulses, and a plurality of phase encoding switched magnetic field gradients;

b) acquiring the MR spin echo signals without application of frequency encoding magnetic field gradients;

c) reconstructing an MR image from the acquired MR spin echo signals.

A computer program adapted for carrying out the imaging procedure of the invention can advantageously be implemented on any common computer hardware, which is presently in clinical use for the control of magnetic resonance scanners. The computer program can be provided on suitable data carriers, such as CD-ROM or diskette. Alternatively, it can also be downloaded by a user from an Internet server.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings

DETAILED DESCRIPTION OF THE EMBODIMENTS

Figure 1:
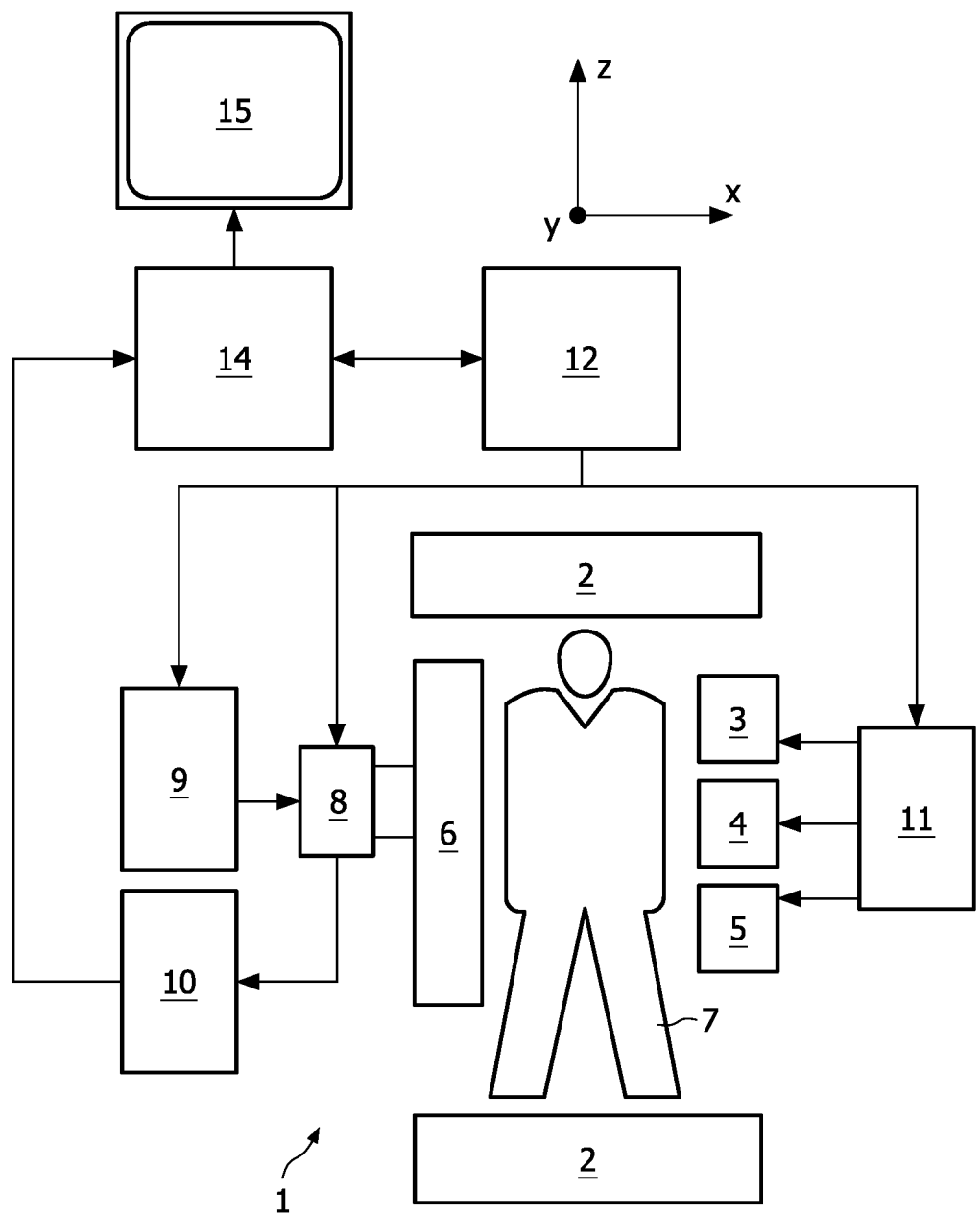
FIG. 1 shows an MR scanner according to the invention.

In FIG. 1 an MR imaging device 1 in accordance with the present invention is shown as a block diagram. The apparatus 1 comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labelled the z-direction, the two directions perpendicular thereto the x- and y-directions. The gradient coils 3, 4 and 5 are energized via a power supply 11. The imaging device 1 further comprises an RF transmit antenna 6 for emitting radio frequency (RF) pulses to a body 7. The antenna 6 is coupled to a modulator 9 for generating and modulating the RF pulses. Also provided is a receiver for receiving the MR signals, the receiver can be identical to the transmit antenna 6 or be separate. If the transmit antenna 6 and receiver are physically the same antenna as shown in FIG. 1, a send-receive switch 8 is arranged to separate the received signals from the pulses to be emitted. The received MR signals are input to a demodulator 10. The send-receive switch 8, the modulator 9, and the power supply 11 for the gradient coils 3, 4 and 5 are controlled by a control system 12. Control system 12 controls the phases and amplitudes of the RF signals fed to the antenna 6. The control system 12 is usually a microcomputer with a memory and a program control. The demodulator 10 is coupled to reconstruction means 14, for example a computer, for transformation of the received signals into images that can be made visible, for example, on a visual display unit 15. For the practical implementation of the invention, the MR device 1 comprises a programming for carrying out the above-described imaging procedure.

Figure 2A:
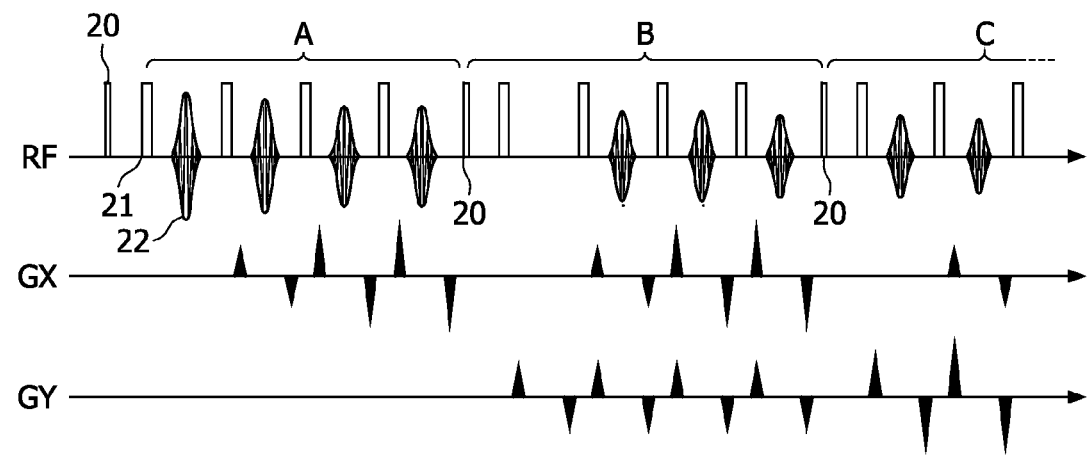
FIG. 2 illustrates the MR imaging pulse sequence of the invention according to a first embodiment (Cartesian sampling scheme)
Figure 3A:
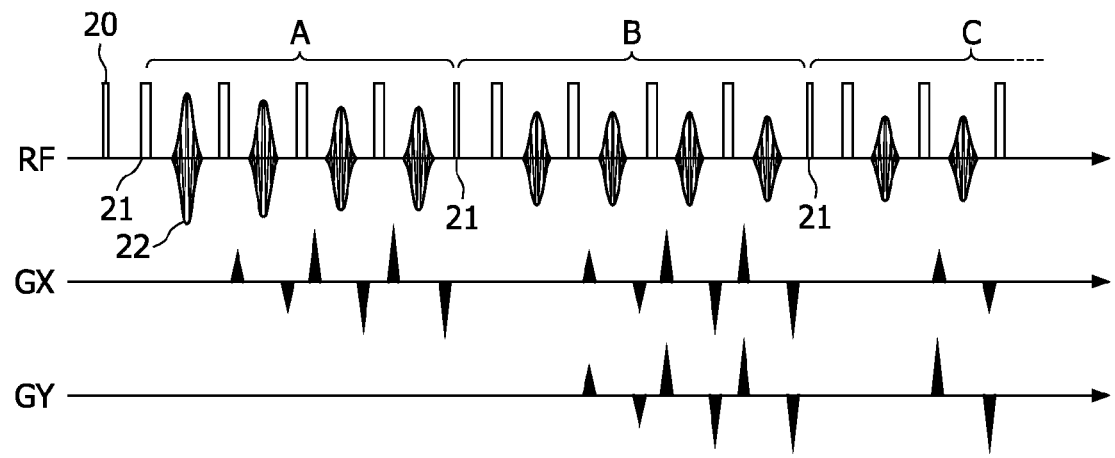
FIG. 3 illustrates the MR imaging pulse sequence of the invention according to a second embodiment (radial sampling scheme).

FIGS. 2a and 3a illustrate the generation and acquisition of MR spin echo signals according to the imaging sequence proposed by the invention. Spatially non-selective RF pulses 20 are applied for excitation of the measured spin species. After each excitation pulse 20 a plurality of refocusing RF pulses 21 is applied such that a corresponding number of MR spin echo signals 22 is generated. The MR spin echo signals 22 are acquired without application of frequency encoding or 'readout' magnetic field gradients in order to avoid ghosting caused by chemical shift effects. K-space is sampled by using phase encoding switched magnetic field gradients GX and GY in the x- and y-directions respectively. After each phase encoding gradient a rewinding gradient, i.e. a gradient of equal strength in the opposite direction, is applied in order to cancel the effect of the phase encoding gradient before the application of the next refocusing RF pulse 21.

Figure 2B:
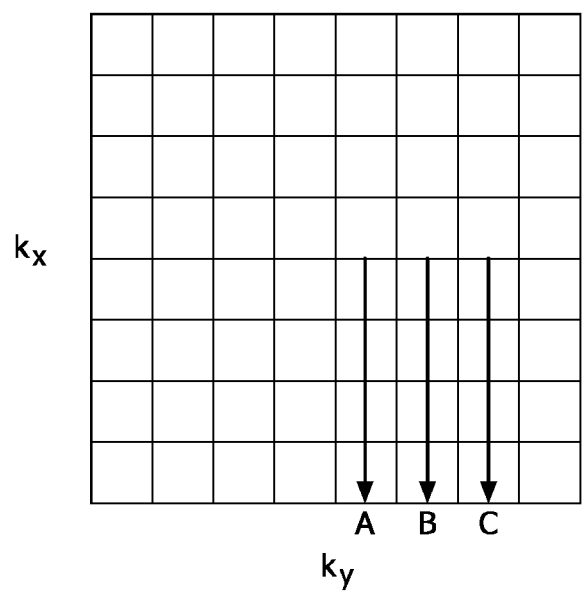
Figure 3B:
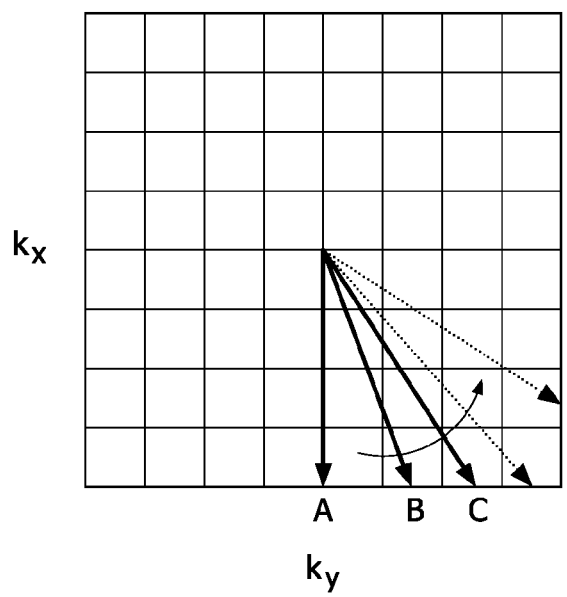

Different two-dimensional schemes of k-space sampling are shown in FIGS. 2 and 3 respectively. FIGS. 2b and 3b illustrate schematically the k-space trajectories A, B, and C resulting from the applied phase-encoding gradients GX and GY shown in FIGS. 2a and 3a. A cartesian sampling scheme is shown in FIG. 2 while a radial sampling scheme is shown in FIG. 3. FIGS. 2a and 3a each show the generation of three echo trains A, B, and C comprising four spin echoes respectively. As shown in FIG. 2b, each k-space trajectory A, B, and C starts from and runs perpendicular to the horizontal central line of k-space, in either the positive or the negative $k_x$-direction. K-space is filled by shifting the starting point of each trajectory incrementally along the $k_y$-direction such that each point of the grid is sampled once. In FIG. 3b, in contrast, each trajectory A, B, and C starts from the central point of k-space and runs along a radial trajectory. K-space is filled by incrementing the angular direction of the k-space trajectories in the $k_x$-$k_y$-plane. The k-space trajectores run along radial directions. However, the sampled points in k-space are distributed on a rectangular grid, as shown in FIG. 3b. In this way the MR image can easily be reconstructed by means of a two-dimensional Fourier transform. The angular resolution of the radial k-space sampling shown in FIG. 3b determines the number of k-space trajectories acquired or, in other words, the k-space fill factor of the applied radial sampling scheme.

When a sufficiently high fill factor is chosen according to the invention (which does not result in an intolerable scan time) both the SNR is improved and a complete coverage of k-space is achieved. Experiments have shown that, when the imaging sequence of the invention is applied at a high repetition rate, the radial sampling scheme is less susceptible to image artefacts than the Cartesian scheme. Both k-space sampling schemes described above can also be applied by means of multi-shot sequences. In this case, more than one echo train is generated to sample one radial or cartesian trajectory A, B, or C. The advantage of this proceeding is that a high spatial resolution can be obtained even in case of a very rapid $T_2$ relaxation.

Because a spatially non-selective excitation RF pulse 20 is applied according to the invention in order to avoid chemical shift induced artefacts, the MR images reconstructed from the echo signals acquired as shown in FIGS. 2 and 3 are two-dimensional projection images of the three dimensional volume covered by the examination. A three-dimensional image can be obtained either by combining MR images acquired using different (orthogonal) projection directions or by performing a direct three dimensional sampling of k-space. For three-dimensional sampling of k-space additional phase encoding switched magnetic field gradients would have to be applied in the z-direction.

The invention claimed is:

1. A device for magnetic resonance (MR) imaging of a body placed in an examination volume, the device comprising:
 a main magnet configured to establish a substantially homogeneous main magnetic field in the examination volume;
 coils configured to generate switched magnetic field gradients superimposed upon the main magnetic field;
 an antenna configured to radiate radio frequency (RF) pulses towards the body;
 a controller configured to control the coils and the antenna to generate the magnetic field gradients and the RF pulses;
 a receiver for receiving and sampling magnetic resonance signals; and
 a reconstructor configured to form MR images from the signal samples, the controller being further configured to perform the acts of:
 generating a series of MR spin echo signals from a first nuclear spin species by subjecting at least a portion of the body to an MR imaging purse sequence comprising a spatially non-selective excitation RF pulse, a plurality of refocusing RF pulses, and a plurality of phase encoding switched magnetic field gradients;
 after each phase encoding gradient, applying a rewinding gradient to cancel an effect of the phase encoding gradient before application of a next refocusing RF pulse, wherein the rewinding gradient has equal strength as the phase encoding gradient and an opposite direction of the phase encoding gradient;
 acquiring the MR spin echo signals without application of frequency encoding magnetic field gradients and without application of slice selection magnetic field gradients; and
 reconstructing an MR image from the acquired MR spin echo signals.

2. The device of claim 1, wherein the reconstructed MR image is a projection image of the portion of the body.

3. The device of claim 2, wherein the controller is further configured to determine a spatial position of a site of accumulation of a contrast agent containing the first nuclear spin species by combining at least two projection images having different projection directions.

4. The device of claim 1, wherein the controller is further configured to apply a phase encoding scheme in the generating act such that k-space is sampled in all three spatial directions.

5. The device of claim 1, wherein the controller is further configured to apply a phase encoding scheme in the generating act such that k-space is sampled along a plurality of radial directions.

6. The device of claim 1, wherein the first spin species has a chemical shift spectrum.

7. The device of claim 6, wherein the reconstructor is further configured to reconstruct an MR image for a predetermined spectral position in the chemical shift spectrum and/or for the integrated intensity of the chemical shift spectrums.

8. The device of claim 6, wherein the first nuclear spin species is Fluorine 19 ($^{19}$F).

9. The device of claim 6, wherein the reconstructor is further configured to reconstruct MR images selectively for spin species having different chemical shift spectra.

10. The device of claim 1, wherein the controller is further configured to register the MR image reconstructed in the reconstructing act with an MR image acquired from a second nuclear spin species.

11. A method for MR imaging of at least a portion of a body of a patient in an examination volume of an MR device the method comprising the act of:
 generating a series of MR spin echo signals from a nuclear pin species by subjecting at least a portion of the body to an MR imaging pulse sequence comprising a spatially non-selective excitation RF pulse from an antenna, a plurality of refocusing RF pulses, and a plurality of phase encoding switched magnetic field gradients;
 after each phase encoding, gradient, applying a gradient to cancel an effect of the phase encoding gradient before application of a next refocusing RF pulse, wherein the rewinding gradient has equal strength as the phase encoding gradient and an opposite direction of the phase encoding gradient;
 acquiring the MR spin echo signals without application of frequency encoding magnetic field gradients and without application of slice selection magnetic field gradients;
 reconstructing an MR image from the acquired MR spin echo signals.

12. The method of claim 11, wherein the nuclear spin species is $^{19}$F contained in a compound which is applied to the patient prior to MR image acquisition.

13. The method of claim 11, wherein a phase encoding scheme is applied in generating act such that k-space is sampled along a plurality of radial directions.

14. The method of claim 11, wherein MR images are reconstructed selectively for spin species having different chemical shift spectra.

15. A non-transitory computer readable medium embodying computer instructions which, when executed by a processor, configure the processor to perform the acts of:
 generating an MR imaging pulse sequence comprising a spatially non-selective excitation RF pulse, a plurality of refocusing RF pulses, and a plurality of phase encoding switched magnetic field gradients;
 after each phase encoding gradient, applying a rewinding gradient to cancel an effect of the phase encoding gradient before application of a next refocusing RF pulse, wherein the rewinding gradient has equal strength as the phase encoding gradient and an opposite direction of the phase encoding gradient;

acquiring MR spin echo signals without application of frequency encoding magnetic field gradients and without application of slice selection magnetic field gradients;

reconstructing an MR image from the acquired MR spin echo signals.

* * * * *